United States Patent
Hsieh et al.

(10) Patent No.: US 11,662,619 B1
(45) Date of Patent: May 30, 2023

(54) ELECTRONIC DEVICE

(71) Applicant: Darwin Precisions Corporation, Hsinchu County (TW)

(72) Inventors: Yu-An Hsieh, Hsinchu County (TW); Chi-Chang Chen, Taoyuan County (TW); Chia-Hsin Chang, Miaoli County (TW)

(73) Assignee: DARWIN PRECISIONS CORPORATION, Hsinchu County (TW)

( * ) Notice: Subject to any disclaimer, the term of this patent is extended or adjusted under 35 U.S.C. 154(b) by 0 days.

(21) Appl. No.: 17/863,434

(22) Filed: Jul. 13, 2022

(30) Foreign Application Priority Data

Mar. 14, 2022 (TW) ................... 111109267

(51) Int. Cl.
*G02F 1/1335* (2006.01)
*G02F 1/1333* (2006.01)
*H05K 1/18* (2006.01)
*G06F 3/04817* (2022.01)

(52) U.S. Cl.
CPC .... *G02F 1/133512* (2013.01); *G02F 1/13338* (2013.01); *G02F 1/133524* (2013.01); *G06F 3/04817* (2013.01); *H05K 1/189* (2013.01); *G02F 2202/28* (2013.01); *H05K 2201/10136* (2013.01)

(58) Field of Classification Search
CPC .......... G02F 1/133512; G02F 1/13338; G02F 1/133524; G02F 2202/28; G06F 3/04817
See application file for complete search history.

(56) References Cited

U.S. PATENT DOCUMENTS

| | | | | |
|---|---|---|---|---|
| 9,846,455 B2* | 12/2017 | Kim | ...................... | G06F 1/1643 |
| 10,754,384 B2 | 8/2020 | Kim et al. | | |
| 2012/0276957 A1* | 11/2012 | Yang | .................. | H04M 1/0266 |
| | | | | 455/566 |
| 2012/0329526 A1* | 12/2012 | Song | ..................... | G06F 1/1643 |
| | | | | 455/566 |
| 2014/0028583 A1* | 1/2014 | Cho | ...................... | G06F 1/1637 |
| | | | | 345/173 |
| 2014/0192279 A1* | 7/2014 | Akanuma | ............ | G02B 6/0075 |
| | | | | 349/12 |

FOREIGN PATENT DOCUMENTS

| CN | 103345316 A | 10/2013 |
|---|---|---|
| KR | 101475870 B1 | 12/2014 |

\* cited by examiner

*Primary Examiner* — Jessica M Merlin
(74) *Attorney, Agent, or Firm* — WPAT, P.C (57) ABSTRACT

An electronic device includes a display module, a protection cover, a light shielding layer on a bottom surface of the protection cover, a light source on the display module, a light guide plate on the display module and adjacent to the light source, a touch sensitive film above the light guide plate and having a first opening, a first optical adhesive between the touch sensitive film and the protection cover and having a second opening overlapping and communicated with the first opening, and a light shielding element having a portion overlapping the first and second openings. The light shielding element is located on the display module, extends to said portion of the light shielding layer, and is configured to block light passing through the light guide plate, the touch sensitive film, and the first optical adhesive in a non-visible area.

16 Claims, 6 Drawing Sheets

ELECTRONIC DEVICE

RELATED APPLICATIONS

This application claims priority to Taiwan Application Serial Number 111109267, filed Mar. 14, 2022, which is herein incorporated by reference.

BACKGROUND

Field of Invention

The present disclosure relates to an electronic device.

Description of Related Art

Touch display modules have been used in various types of electronic devices, such as smart phones, tablet computers, and digital cameras. Each of the aforementioned electronic devices may have a visible area of a screen and a non-visible area that surrounds the visible area. The non-visible area can have icons for users to touch to operate the electronic device.

However, in order to allow users to easily identify the position of the icon, a backlight module can be usually disposed below the icon. In addition to lighting up the icons, a light from the backlight module may also be transmitted laterally to the visible area of the screen through a touch-sensitive film and an optical adhesive that are above the backlight module, which results in light leakage in the visible area, thereby affecting product yield and product competitiveness, and causing unfavorable visual experience for users.

SUMMARY

One aspect of the present disclosure provides an electronic device.

According to some embodiments of the present disclosure, an electronic device includes a display module, a protection cover, a light shielding layer, a light source, a light guide plate, a touch sensitive film, a first optical adhesive, and a light shielding element. The protection cover is located above the display module. The light shielding layer is located on a bottom surface of the protection cover and is configured to define a non-visible area of the electronic device. The light source is located on the display module and overlaps the non-visible area. The light guide plate is located on the display module, and is adjacent to the light source. The touch sensitive film is located above the light guide plate and has a first opening. The first optical adhesive is located between the touch sensitive film and the protection cover, and has a second opening. The first opening overlaps the second opening and is communicated with the second opening. A portion of the light shielding layer overlaps the first opening and the second opening. The light shielding element is located on the display module and overlaps the non-visible area, and extends to said portion of the light shielding layer. The light shielding element is configured to block light passing through the light guide plate, the touch sensitive film, and the first optical adhesive in the non-visible area.

In some embodiments, the light shielding layer has an icon opening located above the light guide plate and configured to allow light of the light guide plate to pass through.

In some embodiments, the electronic device has a visible area surrounded by the non-visible area, wherein the first opening and the second opening are located between the visible area and the icon opening.

In some embodiments, the light guide plate is located between the light shielding element and the light source.

In some embodiments, a lengthwise direction of the light shielding element, a lengthwise direction of the first opening, and a lengthwise direction of the second opening are the same.

In some embodiments, the first optical adhesive is located between the light shielding layer and the touch sensitive film.

In some embodiments, a top surface of the light shielding element is higher than a top surface of the light guide plate and a top surface of the light source.

In some embodiments, the electronic device further includes a flexible printed circuit board located on the display module, wherein the light guide plate and the light source are located on the flexible printed circuit board.

In some embodiments, a bottom portion of the light shielding element is located on the flexible printed circuit board.

In some embodiments, a bottom portion of the light shielding element is located between the flexible printed circuit board and the display module.

In some embodiments, the light shielding element includes two horizontal portions and a vertical portion, and the two horizontal portions respectively adjoin two ends of the vertical portion and extend in opposite directions to substantially present a Z shape.

In some embodiments, one of the two horizontal portions abuts against said portion of the light shielding layer, and the other is located below the light guide plate.

In some embodiments, the electronic device includes a second optical adhesive located between the display module and the touch sensitive film, wherein the light shielding element is located between the second optical adhesive and the light guide plate.

In some embodiments, the light shielding element is a light shielding foam or a light shielding tape.

In some embodiments, a width of the light shielding element is smaller than a width of the first opening and a width of the second opening.

One aspect of the present disclosure provides an electronic device.

According to some embodiments of the present disclosure, an electronic device includes a display module, a protection cover, a light shielding layer, a light source, a light guide plate, a touch sensitive film, a optical adhesive, and a light shielding element. The protection cover is located above the display module. The light shielding layer is located on a bottom surface of the protection cover and is configured to define a non-visible area of the electronic device. A visible area is surrounded by the non-visible area. The light source is located on the display module and overlaps the non-visible area. The light guide plate is located on the display module and is adjacent to the light source, wherein the light shielding layer has an icon opening located above the light guide plate. The touch sensitive film is located above the light guide plate and has a first opening. The optical adhesive located is between the touch sensitive film and the protection cover, and has a second opening. The first opening overlaps the second opening, and the first opening and the second opening are located between the visible area and the icon opening. The light shielding element is located on the display module, overlaps the non-visible area, and extends to said portion of the light shielding layer.

In the aforementioned embodiments of the present disclosure, since the touch sensitive film and the first optical adhesive respectively has the first opening and the second opening and the light shielding element on the display module extends to the light shielding layer in the first and second openings, when the light source emits light, although the touch sensitive film and the first optical adhesive above the light guide plate may transmit the light laterally, the light can be blocked by the light shielding element in the non-visible area to prevent the light from being transmitted to the visible area of the electronic device. As a result, it can be ensured that the light of the light guide plate is passed through the icon opening of the light shielding layer, and does not enter the visible area and cause the problem of light leakage in the visible area, which can improve the product yield and product competitiveness, and is beneficial to user's visual experience.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
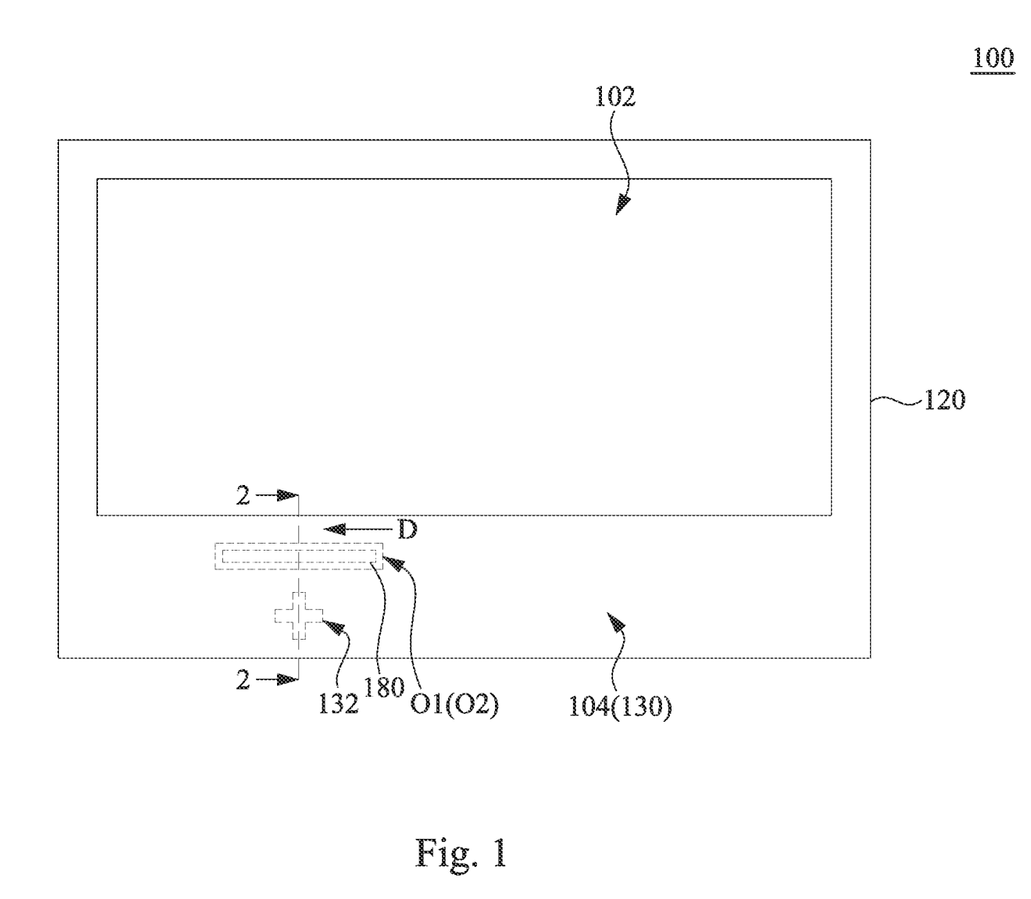
FIG. 1 is a top view of an electronic device according to one embodiment of the present disclosure.
Figure 2:
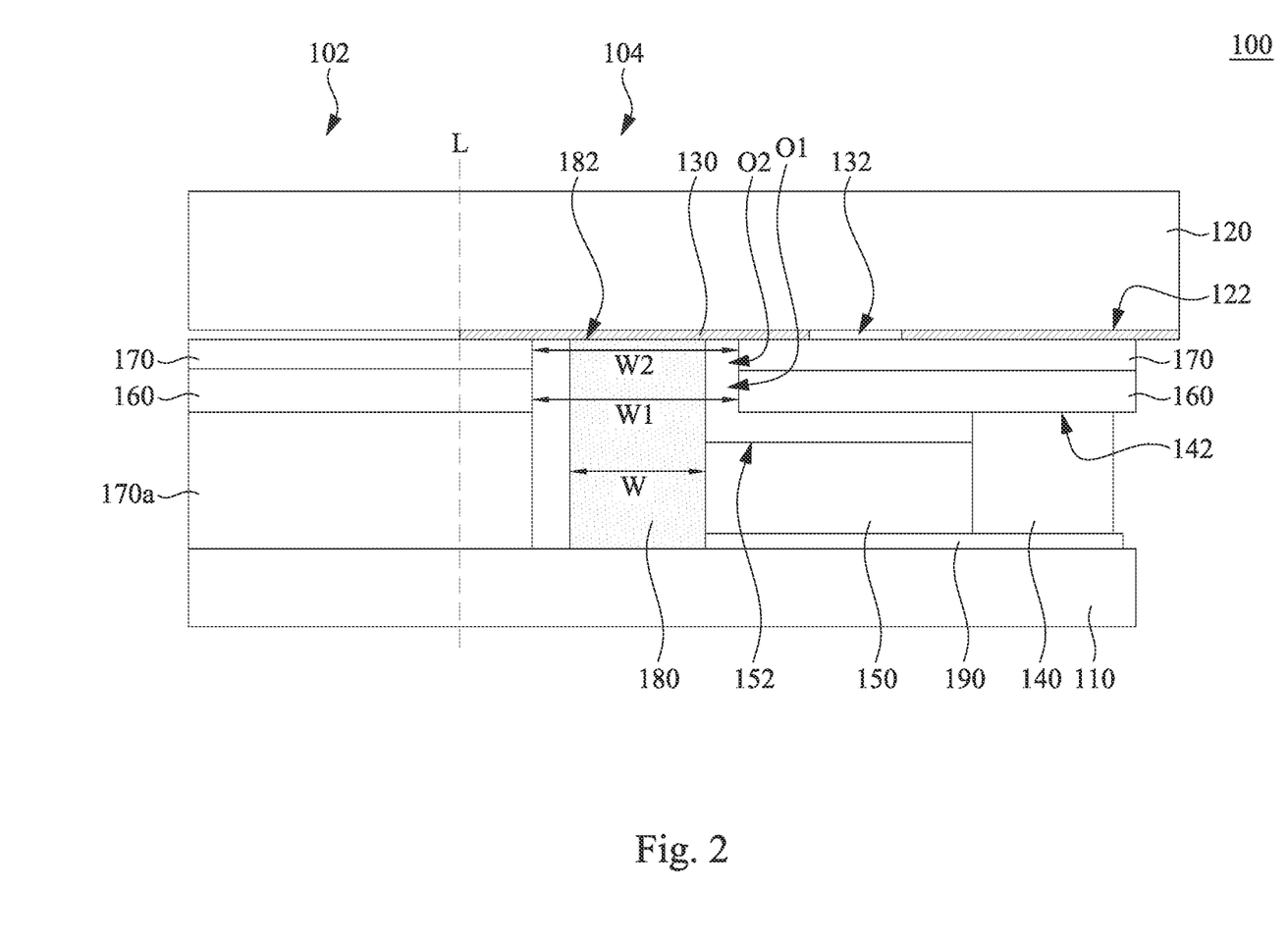
FIG. 2 is a cross-sectional view of the electronic device taken along line 2-2 of FIG. 1.

FIG. 1 is a top view of an electronic device 100 according to one embodiment of the present disclosure. FIG. 2 is a cross-sectional view of the electronic device 100 taken along line 2-2 of FIG. 1. As shown in FIG. 1 and FIG. 2, the electronic device 100 includes a display module 110, a protection cover 120, a light shielding layer 130, a light source 140, a light guide plate 150, a touch sensitive film 160, a first optical adhesive 170, and a light shielding element 180. The protection cover 120 is located above the display module 110. The light shielding layer 130 is located on a bottom surface 122 of the protection cover 120 and is configured to define a non-visible area 104 of the electronic device 100, such as an area at the right side of a dotted line L in FIG. 2. In the description, the non-visible area 104 is referred to as an area overlapping the light shielding layer 130. Moreover, the electronic device 100 has a visible area 102 surrounded by the non-visible area 104 to display images, such as an area at the left side of the dotted line L in FIG. 2. The light source 140 is located on the display module 110 and overlaps the non-visible area 104. The light guide plate 150 is located on the display module 110, and is adjacent to the light source 140. The touch sensitive film 160 is located above the light guide plate 150 and has a first opening O1. The first optical adhesive 170 is located between the touch sensitive film 160 and the protection cover 120, and has a second opening O2. The first opening O1 of the touch sensitive film 160 overlaps the second opening O2 of the first optical adhesive 170, and is communicated with the second opening O2. In addition, a portion of the light shielding layer 130 overlaps the first opening O1 and the second opening O2. The light shielding element 180 is located on the display module 110 and overlaps the non-visible area 104. The light shielding element 180 extends to said portion of the light shielding layer 130 overlapping the first opening O1 and the second opening O2.

Furthermore, the light shielding layer 130 has an icon opening 132 located above the light guide plate 150, and the icon opening 132 may be pressed by users to enable the touch sensitive film 160 to transmit a corresponding signal to control the electronic device 100. In FIG. 1, the first opening O1 and the second opening O2 that overlap each other are located between the visible area 102 and the icon opening 132.

Figure 3:
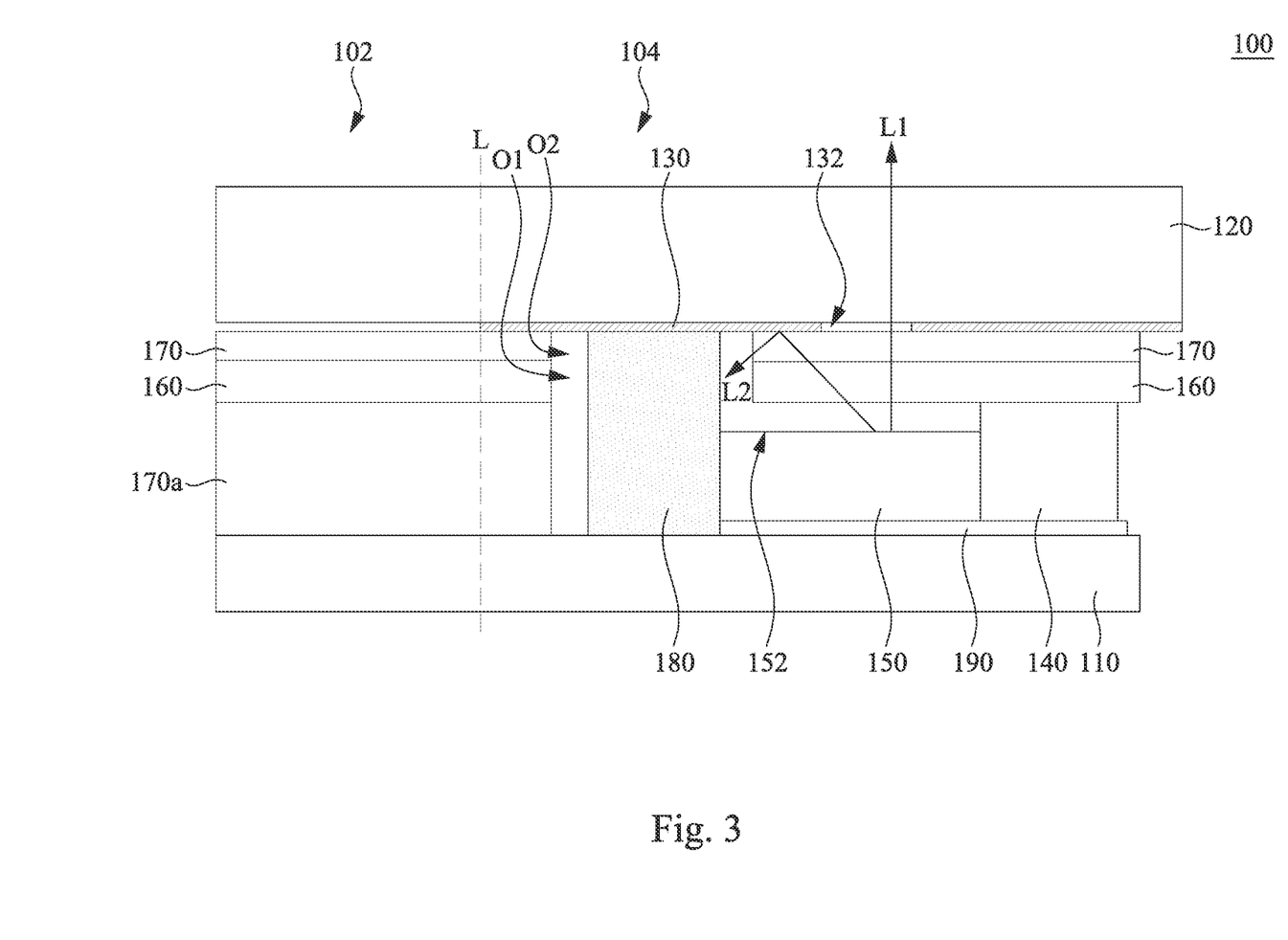
FIG. 3 is a schematic view of light paths when the electronic device of FIG. 2 is in use.

FIG. 3 is a schematic view of light paths when the electronic device 100 of FIG. 2 is in use. As shown in FIG. 2 and FIG. 3, when the light source 140 emits light, the light guide plate 150 may receive the light of the light source 140 and emit the light from a light emitting surface (e.g., a top surface 152) of the light guide plate 150. The light guide plate 150 may emit an upward light L1 and an oblique light L2. The icon opening 132 of the light shielding layer 130 may allow the light L1 of the light guide plate 150 to pass through, such that users outside the protection cover 120 can see the lighted icon opening 132. In addition, the light shielding element 180 may block light passing through the light guide plate 150, the touch sensitive film 160, and the first optical adhesive 170 in the non-visible area 104, such as the emitted light L2 after being transmitted in the touch sensitive film 160 and the first optical adhesive 170.

Specifically, since the touch sensitive film 160 and the first optical adhesive 170 respectively has the first opening O1 and the second opening O2, and the light shielding element 180 on the display module 110 extends to the light shielding layer 130 in the first and second openings O1 and O2, when the light source 140 emits light, although the touch sensitive film 160 and the first optical adhesive 170 above the light guide plate 150 may transmit the light L2 laterally, the light L2 can be blocked by the light shielding element 180 in the non-visible area 104 to prevent the light L2 from being transmitted to the visible area 102 of the electronic device 100. As a result, it can be ensured that the light of the light guide plate 150 is passed through the icon opening 132 of the light shielding layer 130, and does not enter the visible area 102 and cause the problem of light leakage in the visible area 102, which can improve the product yield and product competitiveness, and is beneficial to user's visual experience.

In this embodiment, the light source 140 may be a light emitting diode. The light shielding element 180 may be a light shielding foam, such as a black foam for blocking light and absorbing light. The display module 110 may be a liquid crystal display (LCD) module. The protection cover 120 may be a glass sheet. The light shielding layer 130 may be black ink that is printed on the bottom surface 122 of the protection cover 120 to define the non-visible area 104 of the electronic device 100. The touch sensitive film 160 and the first optical adhesive 170 are transparent to allow light to pass through. The first optical adhesive 170 may be an optical clear adhesive (OCA). The present disclosure is not limited by the aforementioned materials. In other embodiments, different materials with similar functions can be selected according to design requirements. The electronic device 100 may be, but not limited to a smart phone, a tablet computer, or a digital camera.

Moreover, the light guide plate 150 is located between the light shielding element 180 and the light source 140, which ensures that light emitted from the lateral side of the light guide plate 150 cannot enter the visible area 102 directly. In this embodiment, a top surface 182 of the light shielding element 180 is higher than the top surface 152 of the light guide plate 150 and a top surface 142 of the light source 140, which can effectively prevent light from being transmitted to the visible area 102. The first optical adhesive 170 is located between the light shielding layer 130 and the touch sensitive film 160, such that the touch sensitive film 160 can be attached to the light shielding layer 130 through the first optical adhesive 170.

Furthermore, the electronic device 100 further includes a flexible printed circuit board 190 located on the display module 110, wherein the light guide plate 150 and the light source 140 are located on the flexible printed circuit board 190. The flexible printed circuit board 190 is electrically connected to the light source 140 to provide power to the light source 140. In this embodiment, a bottom portion of the light shielding element 180 is located on the flexible printed circuit board 190. The electronic device 100 further includes a second optical adhesive 170a located between the display module 110 and the touch sensitive film 160 such that the touch sensitive film 160 can be attached to the display module 110 through the second optical adhesive 170a. The light shielding element 180 is located between the second optical adhesive 170a and the light guide plate 150, which can prevent the light of the light guide plate 150 from being transmitted to the second optical adhesive 170a in the visible area 102 and causing light leakage.

As shown in FIG. 1 and FIG. 2, a lengthwise direction of the light shielding element 180, a lengthwise direction of the first opening O1 of the touch sensitive film 160, and a lengthwise direction of the second opening O2 of the first optical adhesive 170 are the same, such as a direction D of FIG. 1. A width W of the light shielding element 180 is smaller than a width W1 of the first opening O1 and a width W2 of the second opening O2. Since the first opening O1 and the second opening O2 overlapping each other, the width W1 and the width W2 are substantially the same. Through such a configuration, the contour of the first opening O1 of the touch sensitive film 160 and the contour of the second opening O2 of the first optical adhesive 170 may greater than the contour of the light shielding element 180.

It is to be noted that the connection relationships, the materials, and the advantages of the elements described above will not be repeated in the following description. In the following description, other types of electronic devices will be described.

Figure 4:
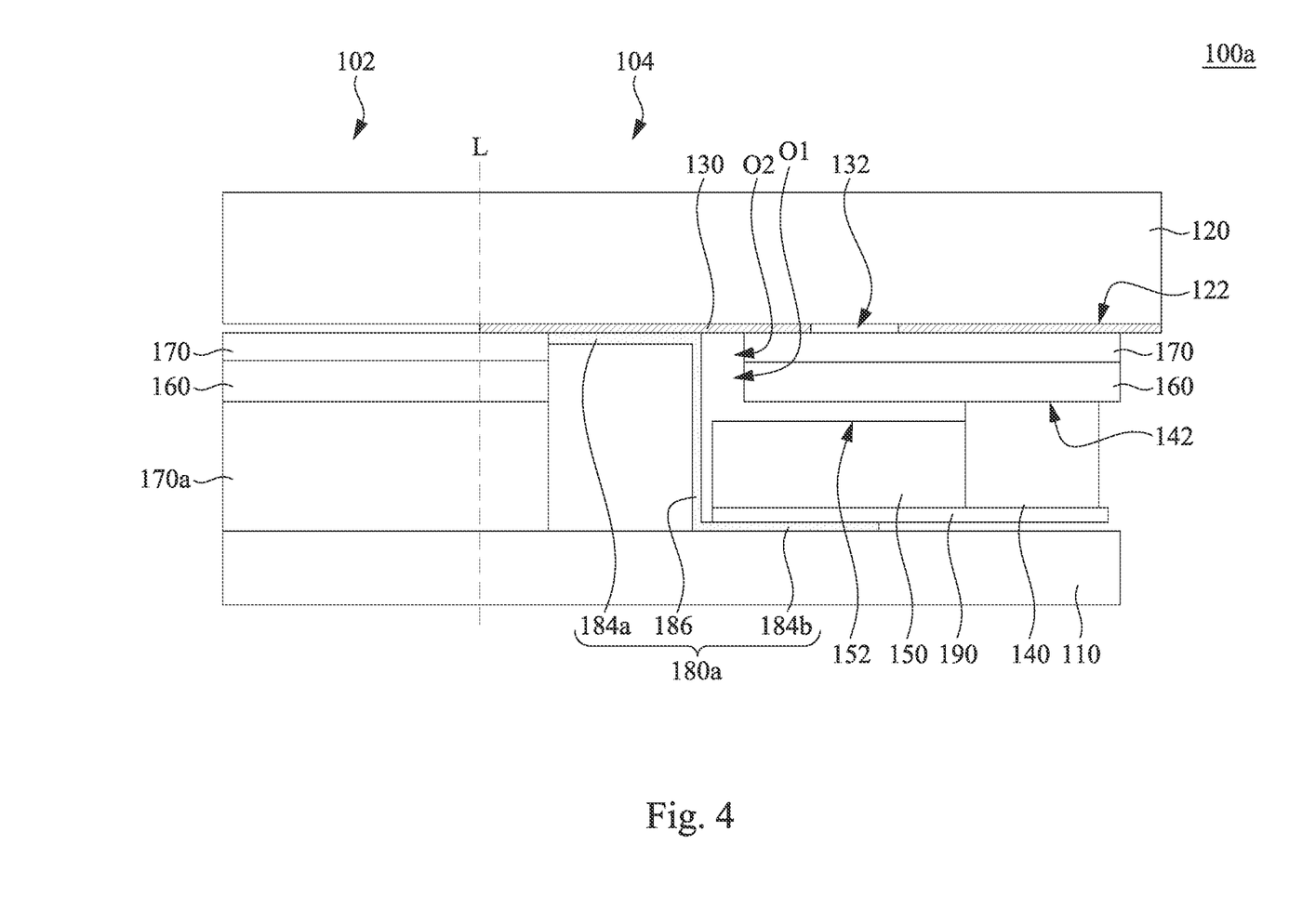
FIG. 4 is a cross-sectional view of an electronic device according to another embodiment of the present disclosure, in which the cross-sectional position of FIG. 4 is the same as that of FIG. 2.
Figure 5:
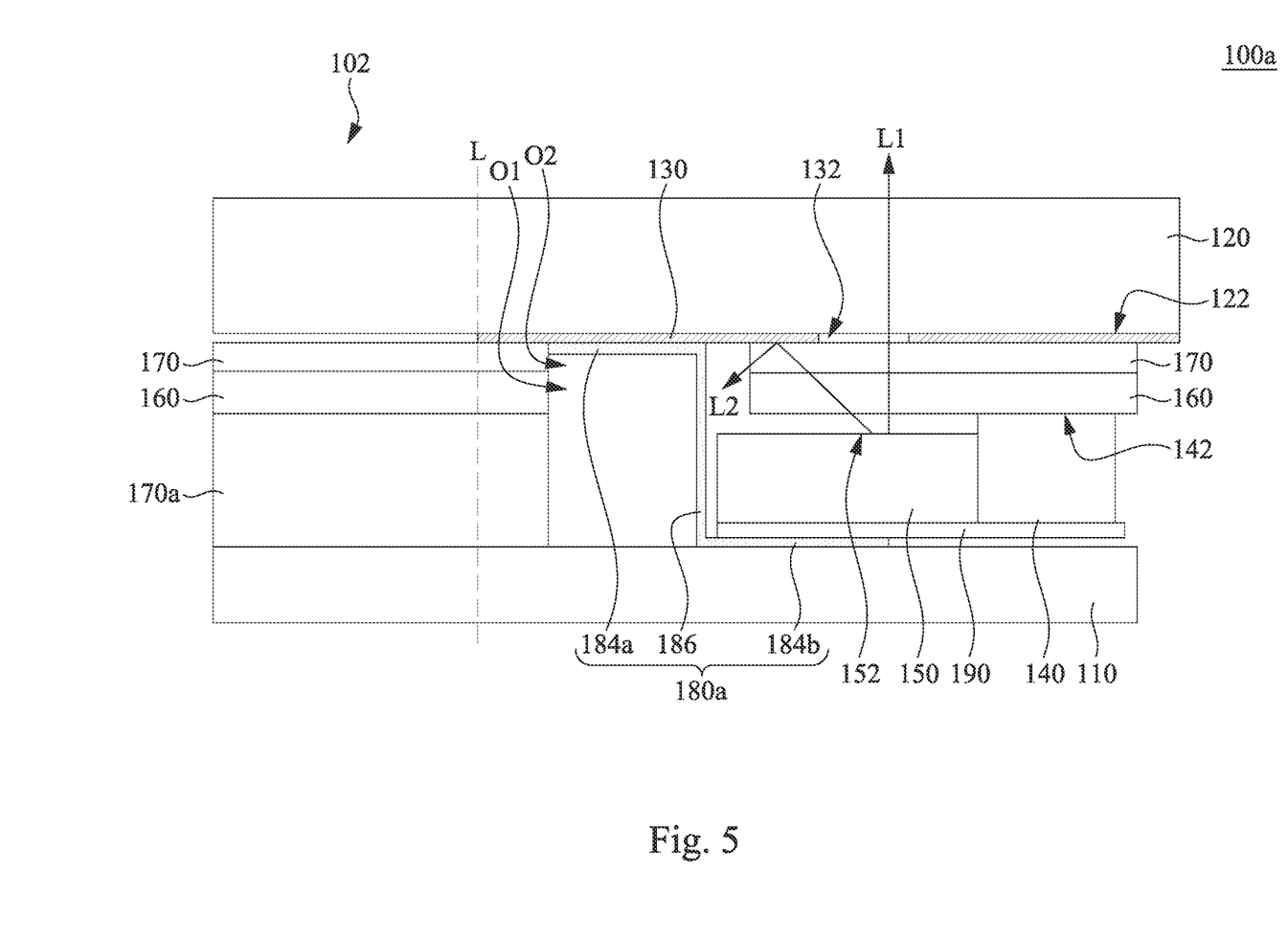
FIG. 5 is a schematic view of light paths when the electronic device of FIG. 4 is in use.

FIG. 4 is a cross-sectional view of an electronic device 100a according to another embodiment of the present disclosure, in which the cross-sectional position of FIG. 4 is the same as that of FIG. 1. FIG. 5 is a schematic view of light paths when the electronic device 100a of FIG. 4 is in use. As shown in FIG. 4 and FIG. 5, the electronic device 100a includes the display module 110, the protection cover 120, the light shielding layer 130, the light source 140, the light guide plate 150, the touch sensitive film 160, the first optical adhesive 170, and a light shielding element 180a. The difference between this embodiment and the embodiment of FIG. 2 is that the light shielding element 180a includes two horizontal portions 184a and 184b and a vertical portion 186, and the two horizontal portions 184a and 184b respectively adjoin two ends of the vertical portion 186 (e.g., a top end and a bottom end) and extend in opposite directions. As a result, the light shielding element 180a substantially presents a Z shape.

In addition, the horizontal portion 184a of the light shielding element 180a may abut against said portion of the light shielding layer 130 overlapping the first and second openings O1 and O2, and the other is located below the light guide plate, and the other horizontal portion 184b is located below the light guide plate 150. In other words, a bottom portion of the light shielding element 180a is located between the flexible printed circuit board 190 and the display module 110, which is beneficial to position the light shielding element 180a.

In this embodiment, the light shielding element 180 may be a light shielding tape, such as a black tape, and may be a single-sided tape or a double-sided tape. The present disclosure is not limited in this regard.

Through such a configuration, when the light source 140 emits light, although the touch sensitive film 160 and the first optical adhesive 170 above the light guide plate 150 may transmit the light L2 laterally, the light L2 can be blocked by the light shielding element 180a in the non-visible area 104 to prevent the light L2 from being transmitted to the visible area 102 of the electronic device 100a. As a result, it can be ensured that the light of the light guide plate 150 is passed through the icon opening 132 of the light shielding layer 130, and does not enter the visible area 102 and cause the problem of light leakage in the visible area 102, which can improve the product yield and product competitiveness, and is beneficial to user's visual experience.

Figure 6:
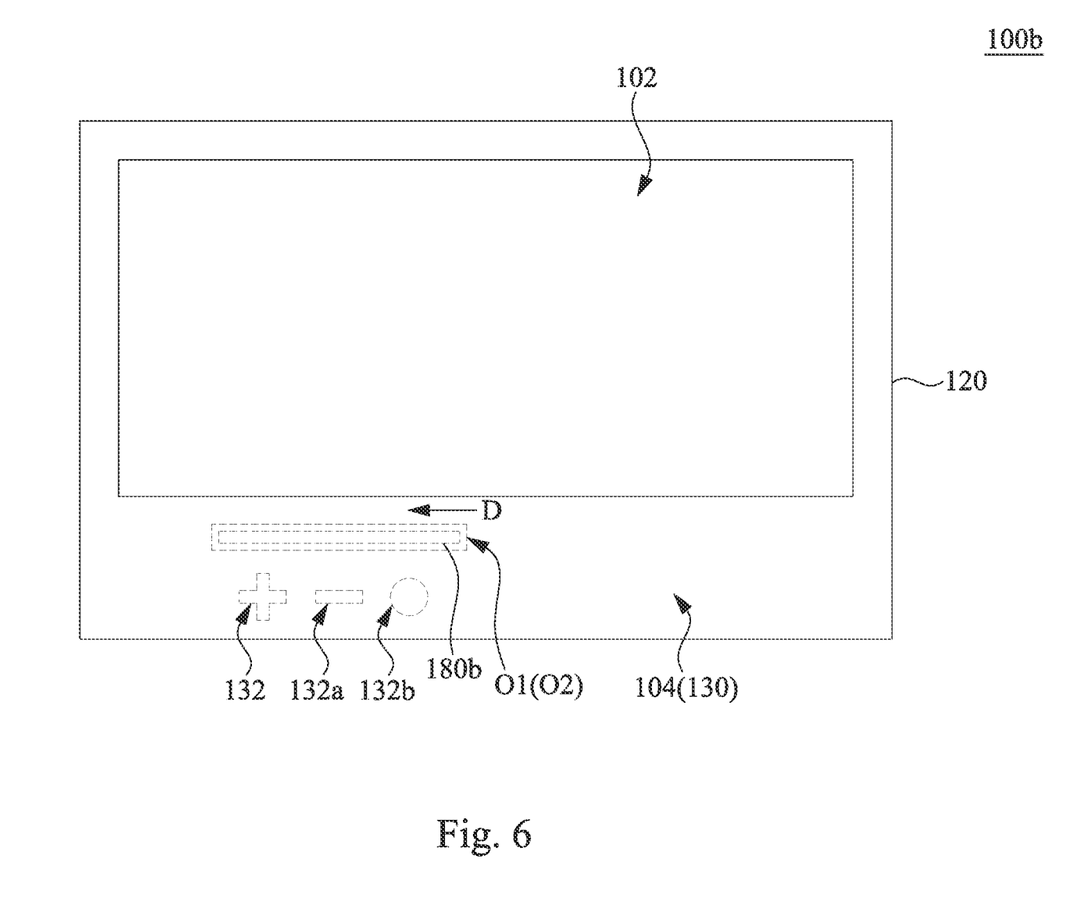
FIG. 6 is a top view of an electronic device according to another embodiment of the present disclosure.

FIG. 6 is a top view of an electronic device 100b according to another embodiment of the present disclosure. The difference between this embodiment and the embodiment of FIG. 1 is that the electronic device 100b further includes icon openings 132a and 132b in addition to the icon opening 132, and a light shielding element 180b of the electronic device 100b is longer. In this embodiment, the light shielding element 180b at least extends from the left side of the icon opening 132 to the right side of the icon opening 132b. As a result, the light shielding element 180b is located between any one of the icon openings 132, 132a, and 132b and the visible area 102. In such a configuration, when one or more of the icon openings 132, 132a, and 132b are lit up, the single light shielding element 180b can be used to block light from entering the visible area 102, thereby saving manufacturing cost and assembling cost.

Moreover, the light shielding foam of FIG. 2 or the light shielding tape of FIG. 4 may be used for the light shielding element 180b as deemed necessary by designs, and the present disclosure is not limited in this regard.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An electronic device, comprising:
 a display module;
 a protection cover located above the display module;
 a light shielding layer located on a bottom surface of the protection cover and configured to define a non-visible area of the electronic device;
 a light source located on the display module and overlapping the non-visible area;
 a light guide plate located on the display module and adjacent to the light source;
 a touch sensitive film located above the light guide plate and having a first opening;
 a first optical adhesive located between the touch sensitive film and the protection cover, and having a second opening, wherein the first opening overlaps the second opening and is communicated with the second opening, and a portion of the light shielding layer overlaps the first opening and the second opening; and
 a light shielding element located on the display module and overlapping the non-visible area, and extending to said portion of the light shielding layer, wherein the light shielding element is configured to block light passing through the light guide plate, the touch sensitive film, and the first optical adhesive in the non-visible area.

2. The electronic device of claim 1, wherein the light shielding layer has an icon opening located above the light guide plate and configured to allow light of the light guide plate to pass through.

3. The electronic device of claim 2, having a visible area surrounded by the non-visible area, wherein the first opening and the second opening are located between the visible area and the icon opening.

4. The electronic device of claim 1, wherein the light guide plate is located between the light shielding element and the light source.

5. The electronic device of claim 1, wherein a lengthwise direction of the light shielding element, a lengthwise direction of the first opening, and a lengthwise direction of the second opening are the same.

6. The electronic device of claim 1, wherein the first optical adhesive is located between the light shielding layer and the touch sensitive film.

7. The electronic device of claim 1, wherein a top surface of the light shielding element is higher than a top surface of the light guide plate and a top surface of the light source.

8. The electronic device of claim 1, further comprising:
 a flexible printed circuit board located on the display module, wherein the light guide plate and the light source are located on the flexible printed circuit board.

9. The electronic device of claim 8, wherein a bottom portion of the light shielding element is located on the flexible printed circuit board.

10. The electronic device of claim 8, wherein a bottom portion of the light shielding element is located between the flexible printed circuit board and the display module.

11. The electronic device of claim 1, wherein the light shielding element comprises two horizontal portions and a vertical portion, and the two horizontal portions respectively adjoin two ends of the vertical portion and extend in opposite directions to substantially present a Z shape.

12. The electronic device of claim 11, wherein one of the two horizontal portions abuts against said portion of the light shielding layer, and the other is located below the light guide plate.

13. The electronic device of claim 1, further comprising:
 a second optical adhesive located between the display module and the touch sensitive film, wherein the light shielding element is located between the second optical adhesive and the light guide plate.

14. The electronic device of claim 1, wherein the light shielding element is a light shielding foam or a light shielding tape.

15. The electronic device of claim 1, wherein a width of the light shielding element is smaller than a width of the first opening and a width of the second opening.

16. An electronic device, comprising:
 a display module;
 a protection cover located above the display module;
 a light shielding layer located on a bottom surface of the protection cover and configured to define a non-visible area of the electronic device, wherein a visible area is surrounded by the non-visible area;
 a light source located on the display module and overlapping the non-visible area;
 a light guide plate located on the display module and adjacent to the light source, wherein the light shielding layer has an icon opening located above the light guide plate;
 a touch sensitive film located above the light guide plate and having a first opening;
 an optical adhesive located between the touch sensitive film and the protection cover, and having a second opening, wherein the first opening overlaps the second opening, and the first opening and the second opening are located between the visible area and the icon opening; and
 a light shielding element located on the display module, overlapping the non-visible area, and extending to said portion of the light shielding layer.

* * * * *